US012791647B2

(12) United States Patent
Kutsuna

(10) Patent No.: US 12,791,647 B2
(45) Date of Patent: Nov. 10, 2026

(54) MAGNETIC RESONANCE IMAGING APPARATUS, MR IMAGE RECONSTRUCTION APPARATUS AND MR IMAGE RECONSTRUCTION METHOD

(71) Applicant: Canon Kabushiki Kaisha, Tokyo (JP)

(72) Inventor: Hideaki Kutsuna, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 310 days.

(21) Appl. No.: 18/461,945

(22) Filed: Sep. 6, 2023

(65) Prior Publication Data

US 2024/0077566 A1 Mar. 7, 2024

(30) Foreign Application Priority Data

Sep. 7, 2022 (JP) ................................ 2022-142455

(51) Int. Cl.
*G01R 33/565* (2006.01)
*G01R 33/48* (2006.01)

(52) U.S. Cl.
CPC .... *G01R 33/56509* (2013.01); *G01R 33/4818* (2013.01); *G01R 33/4826* (2013.01)

(58) Field of Classification Search
CPC ...................... G01R 33/4818; G01R 33/56509
See application file for complete search history.

(56) References Cited

U.S. PATENT DOCUMENTS 8,314,614 B2 * 11/2012 Eggers .............. G01R 33/5617 324/309
10,156,623 B2 12/2018 Nielsen et al.
2004/0071324 A1 * 4/2004 Norris .............. G01R 33/56509 382/128
2017/0322274 A1 11/2017 Bolster, Jr. et al.
2018/0204358 A1 * 7/2018 An ......................... A61B 5/055
(Continued)

FOREIGN PATENT DOCUMENTS

JP 2007-229443 A 9/2007
JP 2014-008193 A 1/2014
(Continued)

OTHER PUBLICATIONS

Feng et al. MRSIGMA: Magnetic Resonance SIGnature MAtching for real-time volumetric imaging, Magn Reson Med. 2020;84: 1280-1292. (Year: 2020).*
(Continued)

*Primary Examiner* — Steven L Yeninas
(74) *Attorney, Agent, or Firm* — Oblon, McClelland, Maier & Neustadt, L.L.P.

(57) ABSTRACT

An MRI apparatus includes sequence control circuitry and processing circuitry. The sequence control circuitry performs stack-of-stars data acquisition on an imaging region of a subject to acquire time-series k-space data. The processing circuitry divides time-series k-space data into groups relating to a time direction, and calculates for each of the groups a motion feature amount of the imaging region based on k-space data of a k-space central portion. The processing circuitry corrects for each of the groups the k-space data based on the motion feature amount and generates the corrected k-space data. The processing circuitry reconstructs an MR image relating to the imaging region based on the corrected k-space data relating to the groups.

10 Claims, 11 Drawing Sheets

(56) References Cited

U.S. PATENT DOCUMENTS

| | | | | |
|---|---|---|---|---|
| 2020/0249304 | A1* | 8/2020 | Zhong | G01R 33/4835 |
| 2021/0109181 | A1* | 4/2021 | Beck | G01R 33/5618 |
| 2022/0203132 | A1* | 6/2022 | Torres | A61N 5/1049 |
| 2022/0373631 | A1* | 11/2022 | Correia | G01R 33/5635 |
| 2022/0413080 | A1* | 12/2022 | Beck | G01R 33/4826 |

FOREIGN PATENT DOCUMENTS

| | | | |
|---|---|---|---|
| JP | 2015-532610 | A | 11/2015 |
| JP | 2021-506419 | A | 2/2021 |
| WO | WO 2006/051911 | A1 | 5/2006 |

OTHER PUBLICATIONS

Grimm et al. Self-gating Reconstructions of Motion and Perfusion for Free-breathing T1-weighted DCE-MRI of the Thorax Using 3D Stack-of-stars GRE Imaging, Proc. Intl. Soc. Mag. Reson. Med. 20 (2012) (Year: 2012).*

Zhang et al., 3D self-ated cardiac cine imaging at 3 Tesla using stack-of-stars bSSFP with tiny golden angles and compressed sensing, Magn. Reson. Med. 2019;81:3234â3244. (Year: 2019).*

Serai et al., Newly Developed Methods for Reducing Motion Artifacts inPediatric Abdominal MRI: Tipsand Pearls, AJR 2020; 214: 1042-1053 (Year: 2020).*

Japanese Office Action mailed May 12, 2026, issued in Japanese Patent Application No. 2022-142455.

* cited by examiner

MAGNETIC RESONANCE IMAGING APPARATUS, MR IMAGE RECONSTRUCTION APPARATUS AND MR IMAGE RECONSTRUCTION METHOD

CROSS-REFERENCE TO RELATED APPLICATION

This application is based upon and claims the benefit of priority from Japanese Patent Application No. 2022-142455, filed Sep. 7, 2022, the entire contents of which are incorporated herein by reference.

FIELD

Embodiments described herein relate generally to a magnetic resonance imaging apparatus, an MR image reconstruction apparatus, and an MR image reconstruction method.

BACKGROUND

A navigator echo method is known as a technique of correcting a motion of a subject in MR imaging. However, acquisition of data not used for reconstruction lowers a data acquisition rate. As another technique, a method of dividing acquired k-space data in a time direction and performing three-dimensional registration on a reconstructed image based on each divided k-space data set is known. This method however requires more time in data acquisition in order to obtain a sufficient image quality for performing registration, and is therefore only applicable to correction of a relatively slow motion.

DETAILED DESCRIPTION

A magnetic resonance imaging apparatus according to an embodiment includes an acquisition unit, a calculation unit, a correction unit, and a reconstruction unit. The acquisition unit performs stack-of-stars data acquisition on an imaging region of a subject to acquire time-series k-space data. The calculation unit divides the time-series k-space data into a plurality of groups relating to a time direction, and calculates for each of the groups a motion feature amount indicative of a degree of motion of the imaging region based on k-space data of a k-space central portion. The correction unit, for each of the groups, corrects the k-space data based on the motion feature amount and generates corrected k-space data. The reconstruction unit reconstructs an MR image relating to the imaging region based on the corrected k-space data relating to the plurality of groups.

Hereinafter, the embodiment of a magnetic resonance imaging apparatus, an MR image reconstruction apparatus, and an MR image reconstruction method will be explained in detail with reference to the accompanying drawings.

Figure 1:
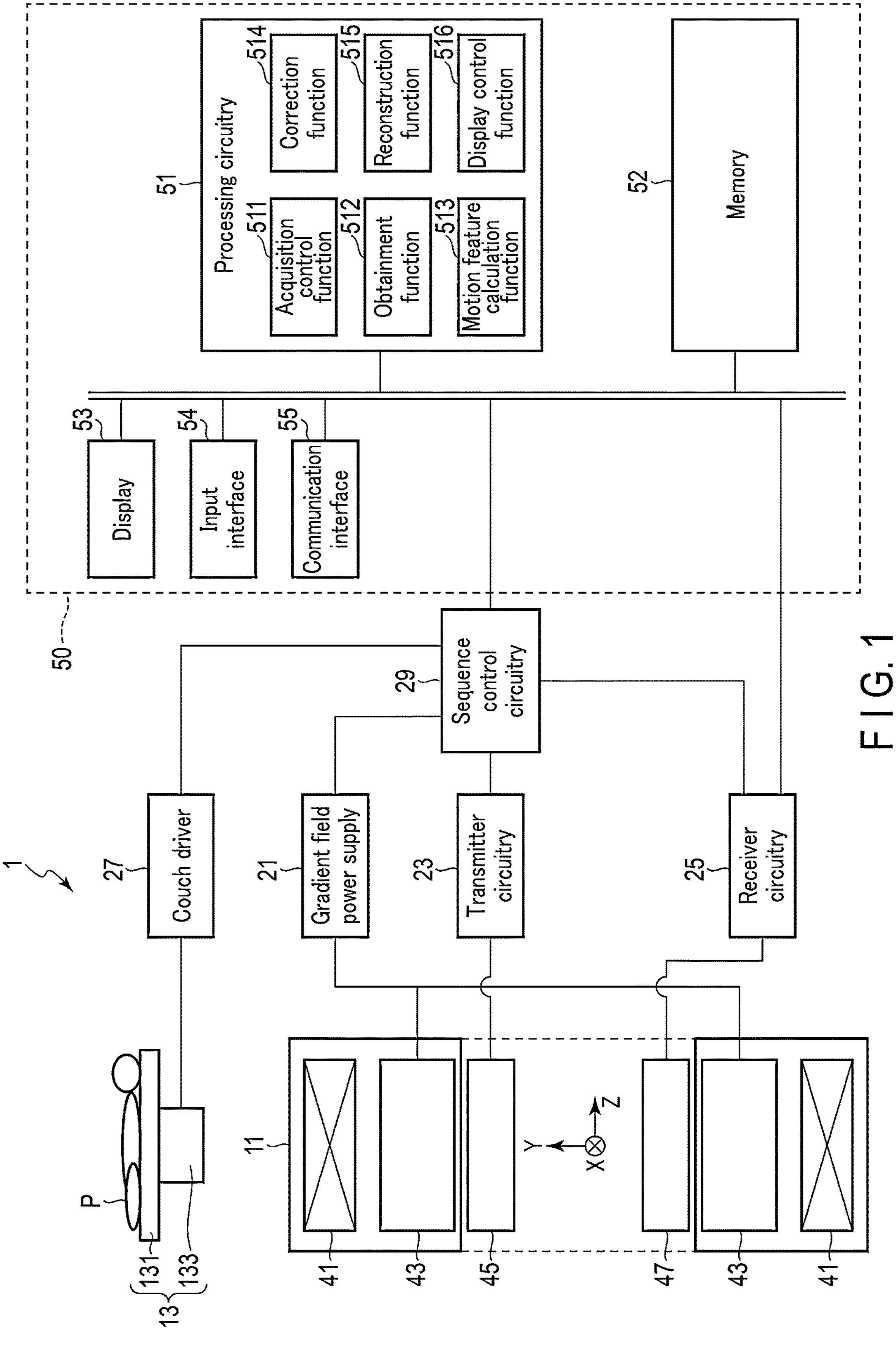
FIG. 1 is a diagram showing a configuration of a magnetic resonance imaging apparatus according to an embodiment.

FIG. 1 is a block diagram of the configuration of a magnetic resonance imaging apparatus 1 according to the present embodiment. As shown in FIG. 1, the magnetic resonance imaging apparatus 1 includes a gantry 11, a couch 13, a gradient field power supply 21, transmitter circuitry 23, receiver circuitry 25, a couch driver 27, sequence control circuitry 29, and a host computer 50.

The gantry 11 includes a static magnetic field magnet 41 and a gradient magnetic field coil 43. The static magnetic field magnet 41 and the gradient magnetic field coil 43 are accommodated in the housing of the gantry 11. A bore with a hollow shape is formed in the housing of the gantry 11. A transmitter coil 45 and a receiver coil 47 are disposed in the bore of the gantry 11.

The static magnetic field magnet 41 has a hollow approximately cylindrical shape and generates a static magnetic field inside the approximate cylinder. The static magnetic field magnet 41 uses, for example, a permanent magnet, superconducting magnet, normal conducting magnet, etc. The central axis of the static magnetic field magnet 41 is defined as a Z axis; an axis vertically perpendicular to the Z axis is defined as a Y axis; and an axis horizontally perpendicular to the Z axis is defined as an X axis. The X-axis, the Y-axis and the Z-axis constitute an orthogonal three-dimensional coordinate system.

The gradient magnetic field coil 43 is a coil unit attached to the inside of the static magnetic field magnet 41 and formed in a hollow approximately cylindrical shape. The gradient magnetic field coil 43 generates a gradient magnetic field upon receiving a current supplied from the gradient field power supply 21. Specifically, the gradient magnetic field coil 43 includes three coils corresponding respectively to the X, Y, and Z axes which are perpendicular to each other. The three coils generate gradient magnetic fields in which the magnetic field magnitude changes along the X, Y, and Z axes. The gradient magnetic fields along the X, Y, and Z axes are combined to generate a slice selective gradient magnetic field Gs, a phase encoding gradient magnetic field Gp, and a frequency encoding gradient magnetic field Gr, which are perpendicular to each other, in desired directions. The slice selective gradient magnetic field Gs is used to discretionarily determine an imaging slice. The phase encoding gradient magnetic field Gp is used to change a phase of magnetic resonance signals (hereinafter "MR signals") in accordance with a spatial position. The frequency encoding gradient magnetic field Gr is used to change a frequency of MR signals in accordance with a spatial position. In the following description, it is assumed that the gradient direction of the slice selective gradient magnetic field Gs aligns with the Z axis, the gradient direction of the phase encoding gradient magnetic field Gp aligns with the Y axis, and the gradient direction of the frequency encoding gradient magnetic field Gr aligns with the X axis.

The gradient field power supply 21 supplies a current to the gradient magnetic field coil 43 in accordance with a sequence control signal from the sequence control circuitry 29. Through the supply of the current to the gradient magnetic field coil 43, the gradient field power supply 21 makes the gradient magnetic field coil 43 generate gradient magnetic fields along the X-axis, the Y-axis, and the Z-axis. These gradient magnetic fields are superimposed on the static magnetic field formed by the static magnetic field magnet 41 and applied to the subject P.

The transmitter coil 45 is arranged inside the gradient magnetic field coil 43 and generates a high-frequency pulse (hereinafter referred to as an RF pulse) upon receiving a current supplied from the transmitter circuitry 23.

The transmitter circuitry 23 supplies a current to the transmitter coil 45 in order to apply an RF pulse for exciting a target proton in the subject P to the subject P via the transmitter coil 45. The RF pulse vibrates at a resonance frequency specific to the target protons, and also electrically excites those target protons. An MR signal is generated from an electrically excited target proton and detected by the receiver coil 47. The transmitter coil 45 is, for example, a whole-body coil (WB coil). The whole-body coil may be used as a transmitter/receiver coil.

The receiver coil 47 receives MR signals generated from the target protons in the subject P due to the effects of the RF magnetic field pulse. The receiver coil 47 includes a plurality of receiver coil elements capable of receiving an MR signal. The received MR signal is supplied to the receiver circuitry 25 via wire or radio. Although not shown in FIG. 1, the receiver coil 47 has a plurality of reception channels arranged in parallel. Each receiver channel includes a receiver coil element which receives MR signals, an amplifier which amplifies the MR signals, etc. An MR signal is output from each reception channel. The total number of the reception channels may be equal to, larger than, or smaller than the total number of the receiver coil elements.

The receiver circuitry 25 receives an MR signal generated from the excited target proton via the receiver coil 47. The receiver circuitry 25 processes the received MR signal to generate a digital MR signal. The digital MR signal can be expressed by a k-space defined by spatial frequency. Thus, the digital MR signals are referred to as k-space data. The k-space data is a type of raw data provided to image reconstruction. The k-space data is supplied to the host computer 50 either by wiring or wirelessly.

The transmitter coil 45 and the receiver coil 47 described above are merely examples. A transmitter/receiver coil which has a transmit function and a receive function may be used instead of the transmitter coil 45 and the receiver coil 47. Alternatively, the transmitter coil 45, the receiver coil 47, and the transmitter/receiver coil may be combined.

The couch 13 is installed adjacent to the gantry 11. The couch 13 includes a top plate 131 and a base 133. The subject P is placed on the top plate 131. The base 133 supports the top plate 131 slidably along each of the X-axis, the Y-axis, and the Z-axis. The couch driver 27 is accommodated in the base 133. The couch driver 27 moves the top plate 131 under the control of the sequence control circuitry 29. The couch driver 27 may include, for example, any motor such as a servo motor or a stepping motor.

The sequence control circuitry 29 includes, as hardware resources, a processor such as a central processing unit (CPU) or a micro processing unit (MPU), and a memory such as a read only memory (ROM) or a random access memory (RAM). The sequence control circuitry 29 controls the gradient field power supply 21, the transmitter circuitry 23, and the receiver circuitry 25 synchronously based on a data acquisition sequence received from the acquisition control function 511 of the processing circuitry 51, and performs data acquisition on the subject P and acquires k-space data relating to the subject P. The sequence control circuitry 29 is an example of the acquisition unit.

The sequence control circuitry 29 of the present embodiment performs stack-of-stars data acquisition on an imaging region of a subject and acquires time-series k-space data. The stack of stars is a three-dimensional k-space filling method in which two-dimensional radial acquisition is performed for each of a plurality of slices.

As shown in FIG. 1, the host computer 50 is a computer having processing circuitry 51, a memory 52, a display 53, an input interface 54, and a communication interface 55. The processing circuitry 51 is an example of a processing unit; the memory 52 is an example of a storage unit; the display 53 is an example of the display unit; the input interface 54 is an example of an input unit; and the communication interface 55 is an example of a communication unit.

The processing circuitry 51 includes a processor such as a CPU, etc., as hardware resources. The processing circuitry 51 functions as the main unit of the MRI apparatus 1. For example, the processing circuitry 51 executes various programs to implement an acquisition control function 511, an obtainment function 512, a Motion feature calculation function 513, a correction function 514, a reconstruction function 515, and a display control function 516. The acquisition control function 511 is an example of the acquisition control unit, the obtainment function 512 is an example of the obtaining unit, the Motion feature calculation function 513 is an example of the calculation unit, the correction function 514 is an example of the correction unit, the reconstruction function 515 is an example of the reconstruction unit, and the display control function 516 is an example of the display control unit.

In the acquisition control function 511, the processing circuitry 51 generates a data acquisition sequence for performing stack-of-stars acquisition based on data acquisition conditions. The data acquisition conditions are determined manually by a medical staff member, etc., or automatically by a discretionarily selected algorithm. The data of the data acquisition sequence is supplied to the sequence control circuitry 29.

In the obtainment function 512, the processing circuitry 51 obtains time-series k-space data acquired by the stack-of-stars acquisition. The processing circuitry 51 may obtain k-space data directly from the receiver circuitry 25 or from the memory 52, etc. that stores the k-space data.

In the Motion feature calculation function 513, the processing circuitry 51 divides time-series k-space data into a plurality of groups relating to a time direction. The processing circuitry 51 calculates a feature amount indicative of a degree of motion in an imaging region of a subject P (hereinafter, "a motion feature amount") based on the k-space data of the k-space central portion for each of the groups. The motion feature amount is calculated for each group every predetermined interval of time. The predetermined interval of time corresponds to a temporal resolution of a motion feature amount, and may be set as appropriate by an operator, such as a medical staff. Typically, the predetermined interval of time is set at each time interval of a sample point of k-space data. Specifically, the processing circuitry 51 generates an intermediate image by performing one-dimensional or two-dimensional Fourier transform on the k-space data of the k-space central portion with respect to the k-space direction, and calculates a motion feature amount based on a center of brightness value in the intermediate image every predetermined interval of time.

In the correction function 514, the processing circuitry 51 corrects for each of the groups of the k-space data based on the motion feature amount and generates corrected k-space data. Specifically, the processing circuitry 51 deforms the intermediate image, which has been generated by performing a one-dimensional or two-dimensional Fourier transform on the k-space data of the k-space central portion with respect to the k-space direction, in accordance with a motion feature amount with respect to a real-space direction, and generates corrected k-space data by performing a one-dimensional or two-dimensional inverse Fourier transform on the deformed intermediate image with respect to the k-space direction.

In the reconstruction function 515, the processing circuitry 51 reconstructs an MR image relating to the imaging region of the subject P based on the corrected k-space data generated by the correction function 514. As a reconstruction method, any method for reconstructing an MR image from the k-space data obtained through a non-Cartesian acquisition may be used. As such a reconstruction method, for example, gridding reconstruction, non-uniform fast Fourier transform (NUFET), or machine learning reconstruction may be used. The processing circuitry 51 performs various types of image processing on a reconstructed image. For example, the processing circuitry 51 may perform image processing such as volume rendering, surface rendering, pixel value projection processing, Multi-Planar Reconstruction (MPR) processing, Curved MPR (CPR) processing, and the like.

In the display control function 516, the processing circuitry 51 displays various types of information on the display 53. For example, the processing circuitry 51 causes the display 53 to display an MR image generated by the reconstruction function 515. The processing circuitry 51 may perform display processing, such as gray scale processing, expansion/contraction processing, annotation, etc., on an MR image as appropriate.

The memory 52 is a storage apparatus such as a hard disk drive (HDD), a solid state drive (SSD), an integrated circuitry storage apparatus or the like that stores various information. The memory 52 may be a drive apparatus or the like that reads and writes various information from and to a portable storage medium such as a CD-ROM drive, a DVD drive, a flash memory, and the like. For example, the memory 52 stores imaging conditions, k-space data, MR images, and image reconstruction control programs, etc.

The display 53 displays various types of information via the display control function 516. For example, the display 53 displays an MR image generated by the reconstruction function 515. Examples of the display 53 that can be used as appropriate include a CRT display, a liquid crystal display, an organic EL display, an LED display, a plasma display, or any other display known in the art.

The input interface 54 includes an input apparatus that receives various commands from the user. Examples of the input apparatus that can be used include a keyboard, a mouse, various switches, a touch screen, a touch pad, and the like. The input device is not limited to a device with a physical operation component, such as a mouse or a keyboard. For example, the examples of the input interface 54 also include electrical signal processing circuitry that receives an electrical signal corresponding to an input operation from an external input apparatus provided separately from the magnetic resonance imaging apparatus 1, and outputs the received electrical signal to various types of circuitry. The input interface 54 may be a speech recognition device that converts an audio signal collected by a microphone into command signals.

The communication interface 55 is an interface connecting the magnetic resonance imaging apparatus 1 with a workstation, a picture archiving and communication system (PACS), a hospital information system (HIS), a radiology information system (RIS), and the like via a local area network (LAN) or the like. The network IF transmits and receives various types of information to and from the connected workstation, PACS, HIS, and RIS.

The above configuration is merely an example, and the present embodiment is not limited thereto. For example, the sequence control circuitry 29 may be incorporated in the host computer 50 or may be implemented on the same substrate on which the processing circuitry 51 is implemented. As another example, the gantry 10 and the host computer 50 do not necessarily constitute a pair, and a single host computer may be provided to a plurality of gantries, and a plurality of host computers may be provided in a single gantry.

The magnetic resonance imaging apparatus 1 according to the present embodiment performs motion correction on an imaging region of a subject based on k-space data acquired by stack-of-stars acquisition. Herein, an outline of the stack-of-stars acquisition is described with reference to FIG. 2.

Figure 2:
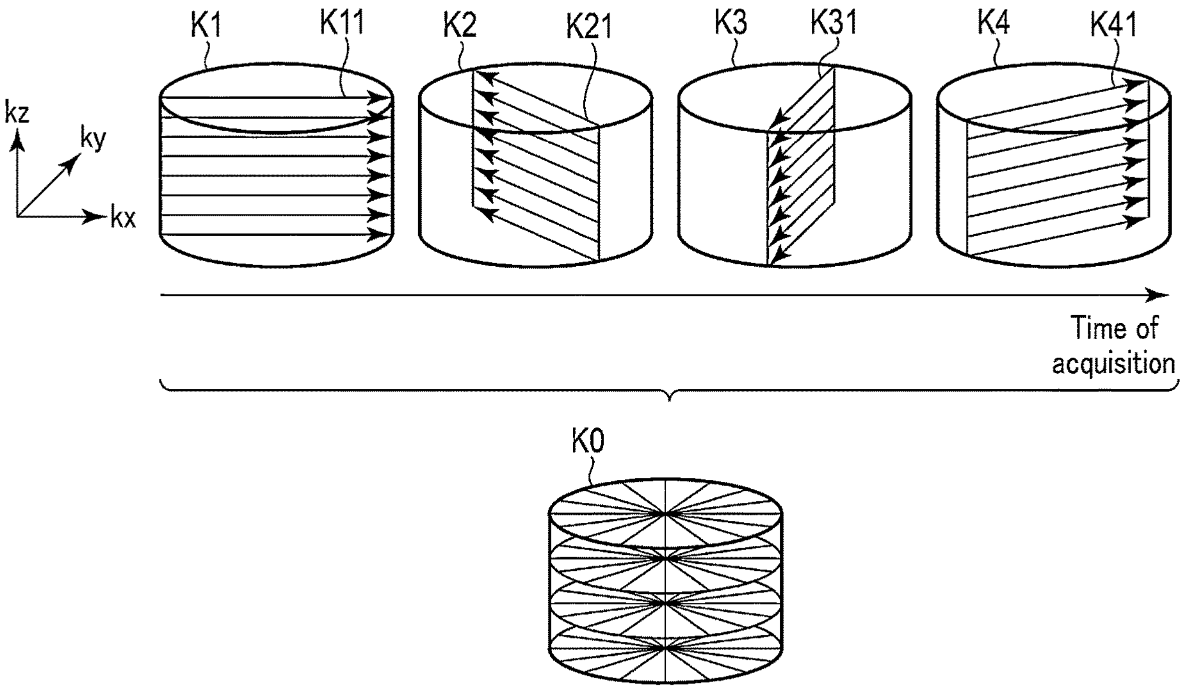
FIG. 2 is a diagram showing an outline of stack-of-stars acquisition.

FIG. 2 is a diagram showing an outline of stack-of-stars acquisition. As shown in the upper half of FIG. 2, the k-space is represented by a three-dimensional space defined by the spatial frequencies kx, ky, and kz. A data acquisition range having approximately a cylindrical shape is set in the k-space. The stack-of-stars acquisition is performed along a k-space trajectory called "spoke Kn1" (n is an index of the angle of the spoke and is the same as the index representing a group, which is described later). The spoke Kn1 passes horizontally through the kx-ky plane and the center of the kx-ky plane. The k-space axis parallel to the spoke Kn1 may be called an "RO axis", and the k-space axis orthogonal to the spoke Kn1 may be called an "SL axis". In the stack-of-stars acquisition, k-space data is acquired along the spoke Kn1 or the RO axis at a predetermined sampling interval. The angle that is defined by the central point of the kz-ky plane and the spoke Kn1 constitutes a spoke angle.

As an example, for the spokes K11 of a single discretionarily selected spoke angle in the kx-ky plane, data acquisition is performed, with a sequential change of the kz position (slice position). If data acquisition is performed at all kz positions for the spokes K11 of the same spoke angle, data acquisition is performed at all kz positions in the same manner for the spokes K21 of the next spoke angle. Thus, the data acquisition is performed for all spoke angles, with a sequential change of the kz position. The number n of spoke angles is not limited to four, and may be any number equal to or greater than 1. Preferably, a current spoke angle is set according to, for example, the golden angle rule, so that the angles are uniformly dispersed in terms of a time direction in the k-space. Herein, a group of all spokes Kn1 of the same angle is called "Group Kn".

As shown in the bottom half of FIG. 2, an MR image relating to a plurality of kz positions (slice positions) is reconstructed based on k-space data of all groups K1, K2, K3, and K4. If all spokes Kn1 are aggregated into one group K0, these spokes Kn1 look like a stack of stars. This is why this data acquisition method is called "stack of stars". As described above, the stack-of-stars acquisition is robust to motion artifacts, as each spoke passes through the center of the kx-ky plane or the vicinity thereof.

Hereinafter, the procedure of the image reconstruction according to the present embodiment is described.

Figure 3:
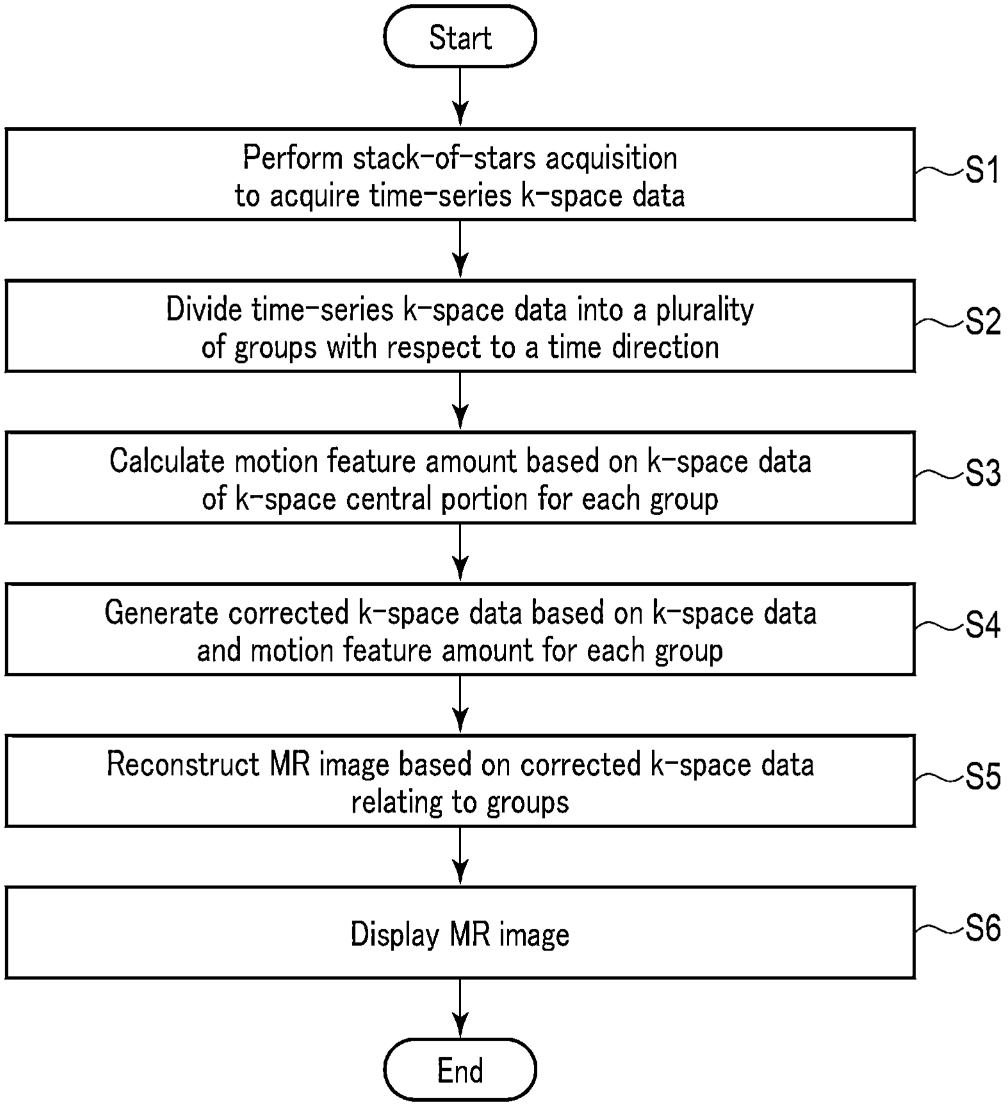
FIG. 3 is a diagram showing procedures of image reconstruction processing in the present embodiment.
Figure 4:
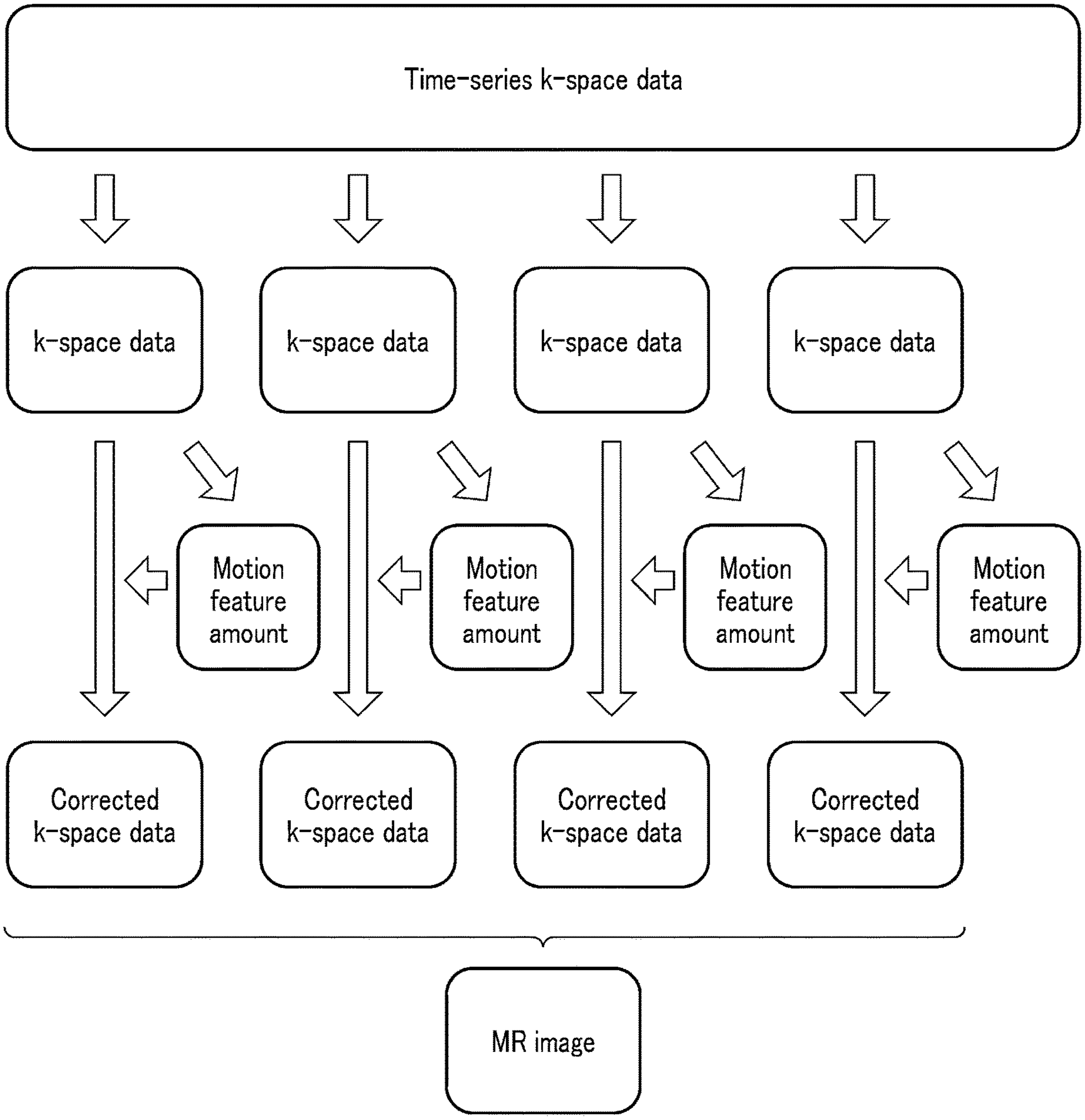
FIG. 4 is a diagram of data transition of the image reconstruction processing shown in FIG. 3.

FIG. 3 is a diagram showing procedures of image reconstruction processing in the present embodiment. FIG. 4 is a diagram of data transition of the image reconstruction processing shown in FIG. 3.

As shown in FIGS. 3 and 4, the processing circuitry 51, through the realization of the acquisition control function 511, performs stack-of-stars acquisition to acquire k-space data (step S1). After step S1, through the realization of the Motion feature calculation function 513, the processing circuitry 51 divides the time-series k-space data acquired in step S1 into a plurality of groups with respect to a time direction (step S2).

Figure 5:
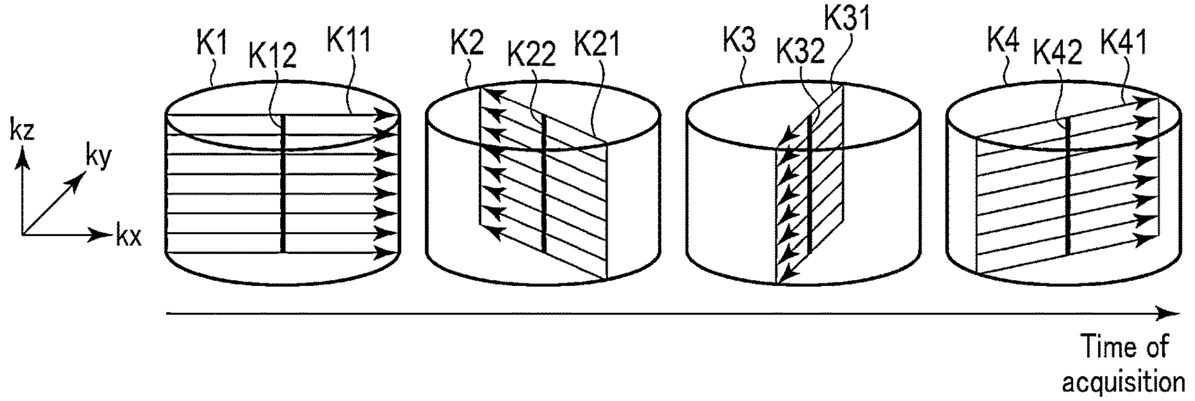
FIG. 5 is a diagram showing an example of division of time-series k-space data into a plurality of groups.

FIG. 5 is a diagram showing an example of division of time-series k-space data into a plurality of groups Kn. As shown in FIG. 5, the processing circuitry 51 divides the time-series k-space data acquired by the stack-of-stars acquisition into a plurality of groups Kn. The number of groups n is not limited to any number, as long as it is a natural number equal to or greater than 2. FIG. 5 shows an example where the number of groups n is 4.

Group Kn is formed by dividing time-series k-space data in a time direction. As an example, each group Kn is set so as to include n spokes Kn1 of the same angle. As described later, since it is necessary to perform FFT in a one- or two-dimensional k-space direction for each group Kn, the number of spokes Kn1 included in each group Kn needs to be 2 or greater.

Each group Kn has, therefore, k-space data of a k-space central portion Kn2 in a horizontal manner across the plurality of spokes Kn1. The k-space central portion Kn2 means that it is a central portion in the kx-ky plane. In other words, the k-space central portion Kn2 is not necessarily a central portion with respect to the kz axis. The k-space central portion Kn2 may include not only the center with respect to the kx-ky plane (kx=ky=0) but also a local region that includes the center. In other words, the k-space central portion Kn2 may be a one-dimensional region or a two-dimensional region in the tree-dimensional k-space. Hereinafter, assume that the k-space central portion Kn2 is a one-dimensional region. The k-space data of the k-space central portion Kn2 will be referred to as “k-space central portion data”.

After step S2, through the realization of the Motion feature calculation function 513, the processing circuitry 51 calculates a motion feature amount based on the k-space central portion data for each group (step S3). Specifically, in step S3, the processing circuitry 51 generates an intermediate image by performing for each of the groups a one-dimensional Fourier transform on the k-space data of the k-space central portion with respect to the k-space direction, and calculates a motion feature amount based on a center of brightness value in the intermediate image every predetermined interval of time. After step S3, through the realization of the correction function 514, the processing circuitry 51 generates for each of the groups corrected k-space data based on the k-space data acquired in step S1 and the motion feature amount calculated in step S3 (step S4). Specifically, in step S4, the processing circuitry 51 deforms for each of the groups an intermediate image with respect to the real-space direction in accordance with the motion feature amount, and generates corrected k-space data by performing one-dimensional inverse Fourier transform on the deformed intermediate image with respect to the k-space direction.

Figure 6:
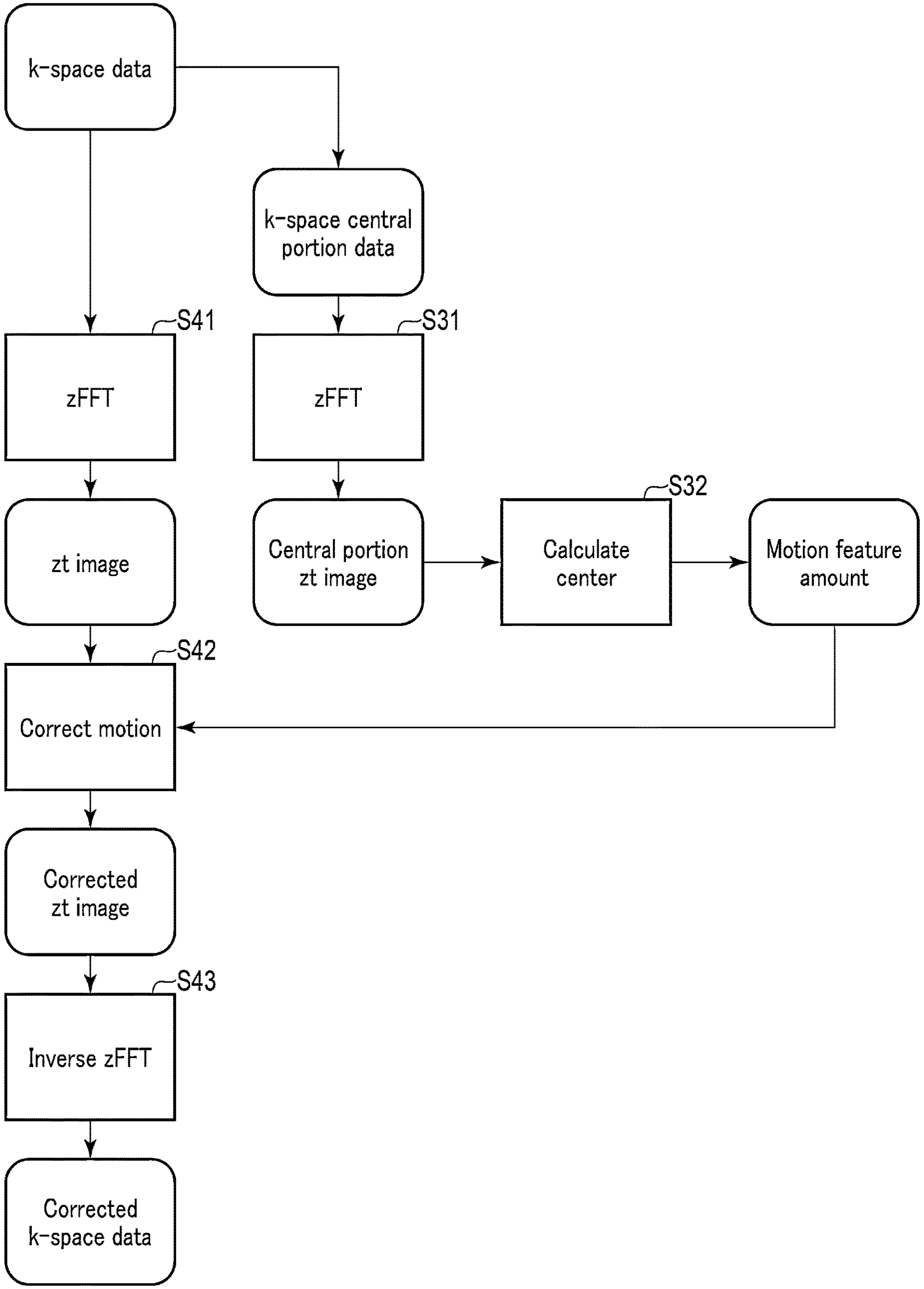
FIG. 6 is a diagram showing detailed procedures in steps S3 to S6 performed on a group.

FIG. 6 shows the detailed procedure in steps S3 to S4. FIG. 6 shows an example of the procedure for one group. As shown in FIG. 6, in step S3, the processing circuitry 51 specifies the k-space central portion data of the k-space data, and performs Fourier transform in the kz-direction (zFFT) on the k-space central portion data to reconstruct a zt image, which is an intermediate image (step S31). The zt image is an image in which a brightness value is allocated to each point of the two-dimensional plane defined by the real-space z axis and the time axis t in accordance with a k-space data value (MR signal intensity). The zt image reconstructed in step S31 will be referred to as a “central portion zt image”, since it is based on the k-space central portion data. The central portion zt image is based on low-frequency components of the k-space data in the kx and ky directions, and reflects global z-direction motion feature of the MR signal.

After step S31, the processing circuitry 51 performs calculation of gravity of a brightness value on the central portion zt image to calculate a motion feature amount (step S32). The motion feature amount is a feature amount that reflects a degree of motion of each anatomical part included in an imaging region. In step S32, the processing circuitry 51 performs calculation of the center of brightness value on the central portion zt image every predetermined interval of time, and calculates the center of brightness value at each time as a motion feature amount. The predetermined interval of time means a length of time targeted for calculating a motion feature amount. Hereinafter, a predetermined interval of time will be referred to as a “calculation target time”. The calculation target time may be set at a time interval of adjacent sample points in the k-space data or set at a discretionarily selected length of time larger than the time interval. The center of brightness value across a plurality of lengths of time indicates a temporal change of the center of brightness value. The temporal change of the center of brightness is described by the center of brightness value zm(t) wherein time is a variable. The center of brightness value zm(t) is calculated based on a brightness value of the central portion zt image in accordance with Expression (1) below. The denominator of Expression (1) is an integral of the brightness value I(z,t) with respect to the real-space z value, and the numerator is an integral of the brightness value I(z,t) and the real-space z value with respect to the real-space z value. The center of brightness value zm(t) represents a temporal change in the real-space z direction in a portion of the imaging region which is considered to be a main portion in terms of the brightness value.

$$z_m(t) = \frac{\int zI(z, t)dz}{\int I(z, t)dz} \tag{1}$$

Figure 7:
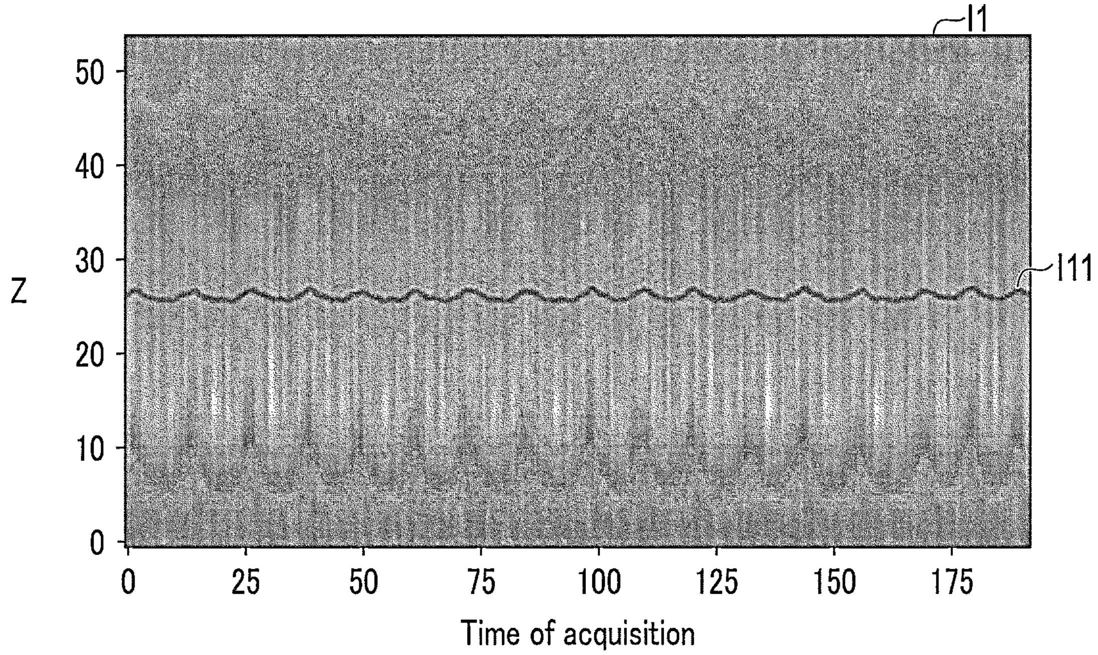
FIG. 7 is a diagram showing a motion feature amount (center of brightness value) and a central portion zt image.

FIG. 7 is a diagram showing a motion feature amount (center of brightness value) and a central portion zt image I1. As shown in FIG. 7, the central portion zt image I1 is an image in which the vertical axis is a real-space z position, the horizontal axis is a time of acquisition, and a brightness value is allocated to each pixel in accordance with a data value of the k-space central portion data value (MR signal intensity). The motion feature amount I11 represents a temporal change of the center of brightness value.

Herein, assume that the imaging region in the present embodiment is an abdomen including a liver. In this case, the high brightness region in the central portion zt image I1 represents a liver region. The central portion zt image I1 visualizes the position change of the liver region in the real-space z direction. The motion feature amount I11 represents a temporal change of the center of brightness value of the liver region in the real-space z direction.

As shown in FIG. 6, the processing circuitry 51 performs zFFT on the k-space data in parallel to step S31 to S32 to generate a zt image (step S41). The zt image generated in step S41 is based on all frequency components of the k-space data. After step S41, the processing circuitry 51 generates a corrected zt image based on the zt image generated in step S41 and the motion feature amount calculated in step S32.

Figure 8:
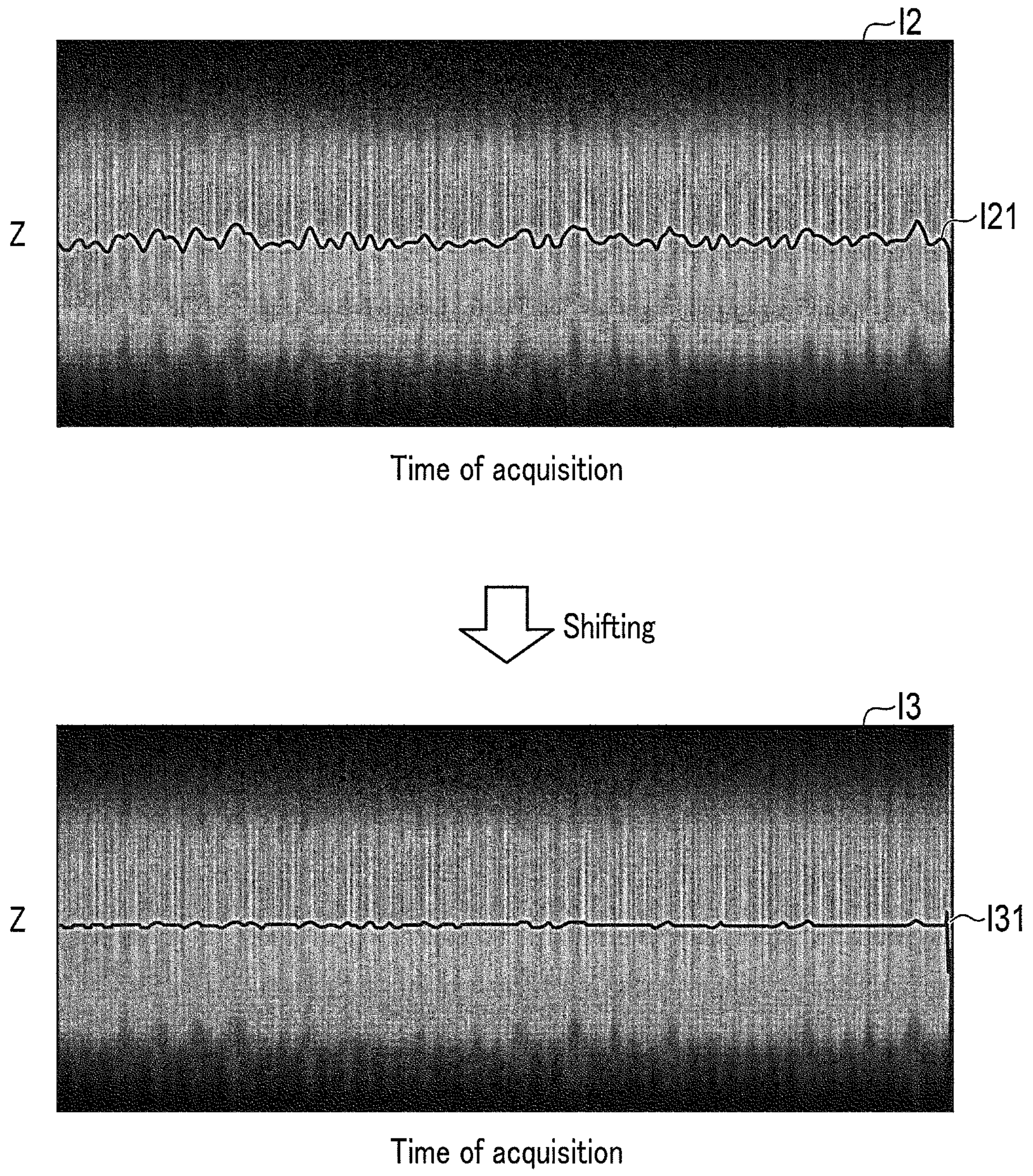
FIG. 8 is a diagram showing an example of correction of the central portion zt image based on the motion feature amount.

FIG. 8 is a diagram showing an example of correction of the zt image based on the motion feature amount. The upper half of FIG. 8 shows an example of the zt image I2 before correction on which the motion feature amount I21 is superimposed. The processing circuitry 51 corrects the zt image I2 by geometrically deforming the zt image I2 in units of calculation target time in accordance with a value according to the motion feature amount. The processing circuitry 51 deforms the zt image I2 in such a manner that the center of brightness value I31 based on the corrected zt image I3 becomes flat. It suffices that the variation of the deformation is selected from parallel movement and expansion/compression as appropriate.

Assume that the variation of the deformation herein is parallel movement (shifting) in the real-space z direction. In this case, the processing circuitry 51 corrects the zt image I2 by shifting the zt image I2 in the z direction in accordance with a value based on the motion feature amount zm(t) (hereinafter, a "shifting distance") in units of calculation target time. The shift distance is set to be a value obtained by multiplying the motion feature amount zm (t) with a weight α. The weight α is set as appropriate in accordance with an imaging region, a case of a diagnosis target, and the like. It is roughly assumed that the weight α is set at a value between 0.5 and 2.0; however, the weight is not limited to this range and may be set at any discretionarily determined value. The shifting distance may be any value based on a motion feature amount zm(t), such as a moving average of a motion feature amount zm(t).

If a pixel in which a brightness value is missing in the z-direction edge portion, which is on the opposite side of the shift direction, occurs in the zt image I2 (hereinafter, a "missing pixel") as a result of shifting the zt image I2, it is preferable to allocate a discretionarily selected brightness value, such as a zero value, to the missing pixel. Alternatively, the brightness value of a pixel excluded from the zt image I2 depending on a shifting direction may be cyclically allocated to the missing pixel. It suffices that a method of filling in a brightness value of the missing pixel is selected as appropriate from the above-described and other methods.

After step S42, the processing circuitry 51 performs inverse FFT regarding the real-space z direction (hereinafter, inverse zFFT) on the corrected zt image to generate the corrected k-space data (step S43). As described above, the processing shown in FIG. 6 is performed for each of the groups, and the corrected k-space data is generated for each of the groups.

As shown in FIGS. 3 and 4, after step S4, the processing circuitry 51, through the realization of the reconstruction function 515, reconstructs an MR image based on the corrected k-space data relating to the plurality of groups (step S5). As the reconstruction method according to step S5, any method may be used as long as an image of the Cartesian coordinate system is reconstructed from k-space data of the stack-of-stars coordinate system. The stack-of-stars coordinate system is a coordinate system defined by the kz axis, the RO axis, and angles of the kz axis and the RO axis. As a reconstruction method that can be used in step S5, gridding reconstruction is known, for example. With gridding reconstruction, the processing circuitry 51 arranges a plurality of corrected k-space data sets regarding a plurality of groups, which are represented by the stack-of-stars coordinate system, in a three-dimensional space of the Cartesian coordinate system, and calculates a data value of each grid point in the three-dimensional space of the Cartesian coordinate system based on the data value of each sampling point in the arranged corrected k-space data sets. The k-space data aligned in the Cartesian coordinate system can be thereby obtained. Then, the processing circuitry 51 reconstructs a three-dimensional MR image by performing FFT on the k-space data aligned in the Cartesian coordinate system.

After step S5 is performed, through the realization of the display control function 516, the processing circuitry 51 causes the MR image reconstructed in step S5 to be displayed (step S6). In step S6, the processing circuitry 51 causes the display 53 to display the reconstructed MR image. The processing circuitry 51 may cause the central portion zt image generated in step S31, the zt image generated in step S41, and the corrected zt image generated in step S42 to be displayed in addition to the MR image. The processing circuitry 51 may display the central portion zt image, the zt image, and the corrected zt image, on which a curve corresponding to a motion feature amount is superimposed.

The image reconstruction processing according to the present embodiment is thus finished.

Figure 9:
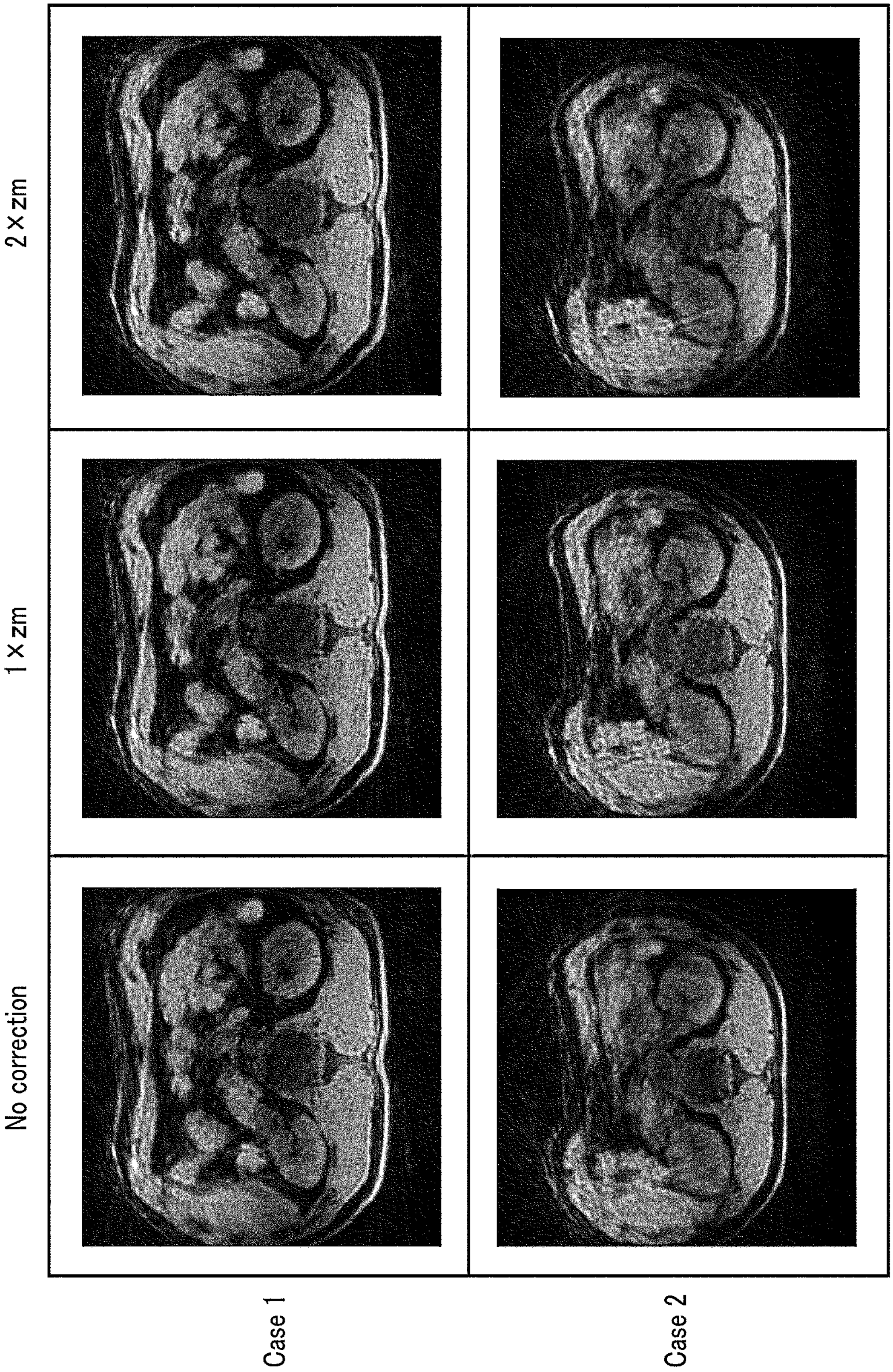
FIG. 9 is a diagram showing a comparison between an MR image with no motion correction (non-corrected image) and MR images with motion correction (1×zm and 2×zm).

FIG. 9 is a diagram showing a comparison between an MR image with no motion correction (non-corrected image) and an MR image with motion correction. Examples of the MR image with a motion correction are an MR image (1×zm) corrected with a weight value α=1 and an MR image (2×zm) corrected with a weight value α=2. FIG. 9 shows the examples of the three types of MR images in case 1 and case 2. Suppose that case 1 and case 2 show an abdomen including a liver as the imaging region but of different patients. For case 1, a strong motion artifact appears in the liver in the non-corrected image, whereas the motion artifact is decreased in the 1×zm and 2×zm MR images. Similarly for case 2, a strong motion artifact appears in the liver in the non-corrected image, whereas the motion artifact is decreased in the 1×zm and 2×zm MR images. Thus, according to the above-described reconstruction processing, it is possible to reconstruct an MR image with a good quality of image and a decreased motion artifact.

The above-described image reconstruction processing is merely an example, and addition, deletion, and/or alteration can be made thereto without departing from the spirit of the invention.

Modification 1

In the foregoing image reconstruction processing, a motion feature amount is a center of brightness value of a central portion zt image. However, the present embodiment is not limited to this example. The processing circuitry 51 according to Modification 1 generates a central portion zt image by performing one- or two-dimensional Fourier transform on k-space central portion data with respect to a k-space direction, and calculates a motion feature amount every predetermined interval of time based on an edge of a specific brightness value region in the central portion zt image.

Figure 10:
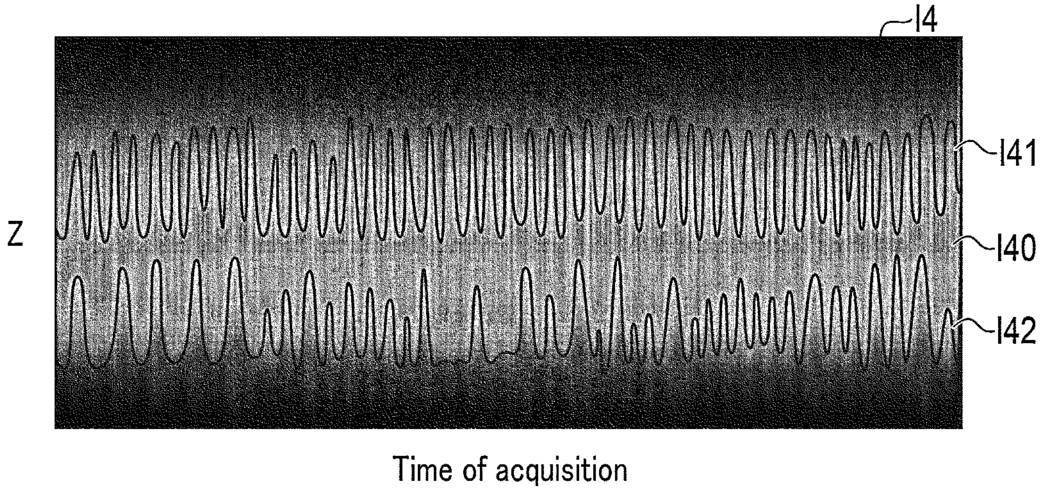
FIG. 10 is a diagram showing an example of a motion feature amount and a central portion zt image according to Modification 1.

FIG. 10 is a diagram showing an example of a motion feature amount and a central portion zt image according to Modification 1. As shown in FIG. 10, the processing circuitry 51 performs image processing on a central portion zt image and detects an edge of a specific brightness value region of the central portion zt image. As an example, the processing circuitry 51 extracts an imaging region I40 having a brightness value higher than a predetermined threshold (hereinafter, a "high brightness value region") by performing threshold processing on the central portion zt image. The high brightness value region I40 is the imaging region shown in white in FIG. 10. Next, the processing circuitry 51 extracts an upper edge portion (hereinafter "upper edge) I41 or a lower edge portion (hereinafter "lower edge) I42) with respect to the high brightness value region I40. Then, the processing circuitry 51 sets the upper edge I41 or the lower edge I42 of each time of acquisition to a motion feature amount. According to Modification 1, it is possible to give variations to the motion feature amount, and to select a motion feature amount calculation method in accordance with an imaging region, a requested quality of an image, a load of processing, etc.

The motion feature amount according to Modification 1 is not limited to the above example. As another example, the processing circuitry 51 may calculate statistical values, such as an average value and an intermediate value of the upper edge I41 and the lower edge I42, as a motion feature amount. The method of calculating the upper edge I41 and the lower edge I42 is not limited to the above-described method. For example, the processing circuitry 51 may perform brightness value edge detection on the central portion zt image I4 to extract an upper edge I41 and/or a lower edge I42. Alternatively, the processing circuitry 51 may perform brightness value edge detection on the central portion zt image I4 to extract an upper edge I41 and/or a lower edge I42.

The specific brightness value region according to Modification 1 is not limited to a high brightness value region. As an example, a specific brightness value region may be an imaging region with a brightness value smaller than the above threshold (a low brightness value region) in the central portion zt image, or an imaging region corresponding to a designated anatomical region.

Modification 2

In the foregoing reconstruction processing, the processing circuitry 51 generates corrected k-space data by correcting a zt image based on a motion feature amount. However, the present embodiment is not limited to this example. The processing circuitry 51 according to Modification 2 generates corrected k-space data by adding a phase gradient to k-space central data based on a motion feature amount.

Figure 11:
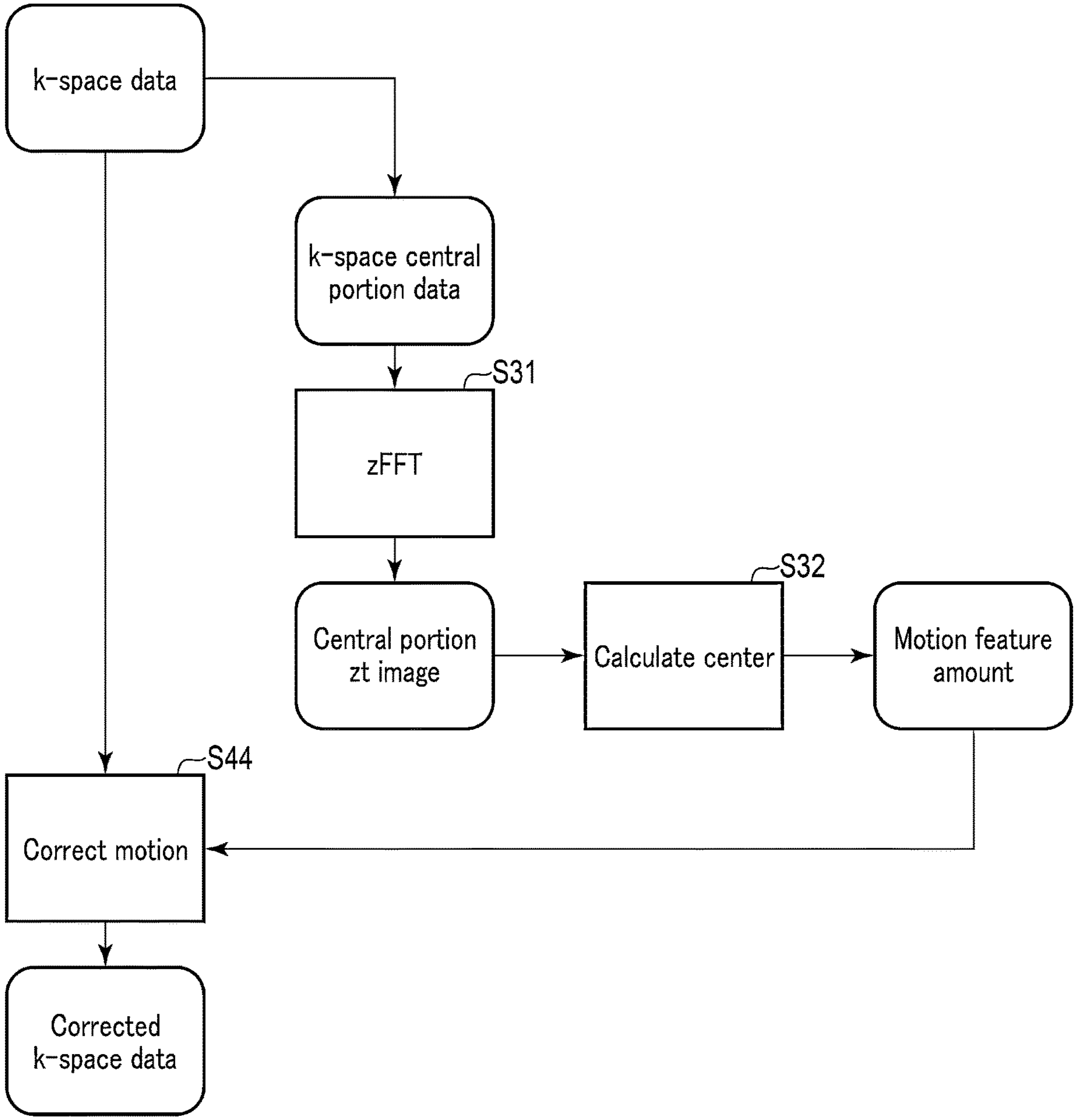
FIG. 11 is a diagram showing detailed procedures in steps S3 to S4 in Modification 2.

FIG. 11 is a diagram showing detailed procedures of steps S3 to S4 in Modification 2. FIG. 11 shows an example of the procedure for one group. The same reference numerals are used for the same processing as that shown in FIG. 6 to simplify the description. As shown in FIG. 11, in step S3, the processing circuitry 51 first specifies the k-space central portion data from the k-space data, and performs zFFT on the k-space central portion data to reconstruct a central portion zt image (step S31). Next, the processing circuitry 51 performs calculation of a center of a brightness value on the central portion zt image to calculate a motion feature amount (step S32). The motion feature amount may be a feature amount based on an edge of the specific brightness value region according to Modification 1.

The processing circuitry 51 then performs motion correction on the k-space data of each group based on the motion feature amount (step S44). Corrected k-space data is thereby generated. Specifically, the processing circuitry 51 adds a phase gradient of a value obtained by multiplying the motion feature amount with the weight value $\alpha$ to a data value of each sample point constituting the k-space data of each group. A phase gradient is added by adding a phase value corresponding to a value multiplied by the weight value $\alpha$ to a phase value of a data value of each sample. The addition of the phase gradient to the k-space data in step S44 is mathematically equivalent to image shifting of a zt image in a spatial direction. Thereafter, the processing circuitry 51 reconstructs the MR image based on the plurality of corrected k-space data sets relating to the plurality of groups (step S5). According to Modification 2, variations can be given to the motion correction of the k-space data based on a motion feature amount, and it is possible to select a motion correction method in accordance with an imaging region, a requested quality of an image, a load of processing, etc.

Modification 3

In the foregoing image reconstruction processing, the k-space central portion was a one-dimensional region. However, the present embodiment is not limited to this example. It suffices that the number of dimensions of the k-space central portion is lower than that of acquired k-space data. Since k-space data according to the stack-of-stars method is three-dimensional, it suffices that the k-space central portion according to Modification 3 is a one-dimensional region or a two-dimensional region in a three-dimensional k-space. As an example, it suffices that the kz axis and the RO axis are selected as two axes that constitute a two-dimensional region. In this case, the zt image can be reconstructed by performing FFT on the k-space data with respect to these axes.

Modification 4

In the foregoing reconstruction processing, the processing circuitry 51, through the realization of the correction function 514, performs parallel movement (shifting) of a zt image in a real-space z direction based on a motion feature amount. However, the present embodiment is not limited to this example. The processing circuitry 51 according to Modification 4 may expand or contract a zt image in the z direction based on a motion feature amount. Specifically, the processing circuitry 51 may expand or contract a zt image for each calculation target time at a magnification based on $\alpha \times zm(t)$. The part that lies off the zt image as a result of expansion may be deleted. For a pixel missing as a result of contraction, a predetermined brightness value may be allocated. The processing circuitry 51 may combine expansion/contraction with parallel movement.

Modification 5

The foregoing image reconstruction processing is performed by the magnetic resonance imaging apparatus 1 having a gantry 11 and a sequence control circuitry 29. However, the present embodiment is not limited to this example. The foregoing image reconstruction processing may be implemented by an image reconstruction apparatus that is capable of obtaining time-series k-space data acquired by performing stack-of-stars acquisition on an imaging region of a subject. It suffices that the image reconstruction apparatus according to Modification 5 is implemented by the host computer 50 from which the acquisition control function 511 is removed.

Generalization

According to the foregoing embodiment and modifications, a magnetic resonance imaging apparatus 1 according to the present embodiment includes sequence control circuitry 29 and processing circuitry 51. The sequence control circuitry 29 performs stack-of-stars data acquisition on an imaging region of a subject to acquire time-series k-space data. The processing circuitry 51 divides time-series k-space data into a plurality of groups relating to a time direction, and calculates for each of the groups a motion feature amount indicative of a degree of motion of the imaging region based on k-space data of a k-space central portion. The processing circuitry 51 corrects the k-space data based on the motion feature amount for each of the groups and generates corrected k-space data. The processing circuitry 51 reconstructs an MR image relating to the imaging region based on the corrected k-space data relating to the plurality of groups.

According to the above-described structure, a motion feature amount is calculated using k-space central portion data, which is smaller than k-space data acquired through a stack-of-stars method, and corrected k-space data is generated based on the motion feature amount. It is thus possible to perform correction that can respond to a relatively fast motion compared to a motion correction with which three-dimensional registration is performed on a reconstructed image. It is therefore possible to obtain an MR image with a high image quality by performing reconstruction using corrected k-space data relating to all groups. According to the above-described structure, it is possible to perform self-navigation that can obtain a motion feature amount from acquired k-space data, and it is in turn possible to improve efficiency in data acquisition compared to the case where sensor data or other data is used.

According to at least one of the foregoing embodiments, it is possible to obtain an MR image in which a motion of a subject is corrected with high accuracy.

The term "processor" used in the above explanation indicates, for example, a circuit, such as a CPU, a GPU, or an Application Specific Integrated Circuit (ASIC), and a programmable logic device (for example, a Simple Programmable Logic Device (SPLD), a Complex Programmable Logic Device (CPLD), and a Field Programmable Gate Array (FPGA)). The processor realizes its function by reading and executing the program stored in the storage circuitry. The program may be directly incorporated into the circuit of the processor instead of being stored in the storage circuit. In this case, the processor implements the function by reading and executing the program incorporated into the circuit. If the processor is for example an ASIC, on the other hand, the function is directly implemented in a circuit of the processor as a logic circuit, instead of storing a program in a storage circuit. Each processor of the present embodiment is not limited to a case where each processor is configured as a single circuit; a plurality of independent circuits may be combined into one processor to realize the function of the processor. In addition, a plurality of structural elements in FIG. 1 may be integrated into one processor to realize the function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
sequence control circuitry configured to acquire time-series k-space data by performing stack-of-stars data acquisition on an imaging region of a subject; and
processing circuitry configured to:
divide the time-series k-space data into a plurality of groups relating to a time direction and calculate for each of the groups a motion feature amount representing a degree of motion of the imaging region based on k-space data of a k-space central portion, wherein each of the plurality of groups is a group of spokes of a same angle;
correct the k-space data based on the motion feature amount for each of the groups and generate corrected k-space data;
reconstruct an MR image relating to the imaging region based on the corrected k-space data relating to the plurality of groups; and
deform an intermediate image, which has been generated by performing for each of the groups a one-dimensional or two-dimensional Fourier transform on the k-space data of the k-space central portion with respect to a k-space direction, in accordance with the motion feature amount with respect to a real-space direction, and generate corrected k-space data by performing one-dimensional or two-dimensional Fourier transform on the deformed intermediate image with respect to the k-space direction.

2. The magnetic resonance imaging apparatus according to claim 1, wherein
the processing circuitry is further configured to generate an intermediate image by performing for each of the groups one-dimensional or two-dimensional Fourier transform on the k-space data of the k-space central portion with respect to the k-space direction, and calculates calculate the motion feature amount based on a center of brightness value in the intermediate image every predetermined interval of time.

3. The magnetic resonance imaging apparatus according to claim 1, wherein
the processing circuitry is further configured to generate an intermediate image by performing for each of the groups one-dimensional or two-dimensional Fourier transform on the k-space data of the k-space central portion with respect to the k-space direction, and calculate the motion feature amount based on an edge of a specific brightness value region in the intermediate image every predetermined interval of time.

4. The magnetic resonance imaging apparatus according to claim 1, wherein
the deformation includes at least one of parallel movement or expansion/contraction.

5. The magnetic resonance imaging apparatus according to claim 1, wherein
the processing circuitry is further configured to generate the corrected k-space data by adding a phase gradient to the k-space data of the k-space central portion based on the motion feature amount.

6. The magnetic resonance imaging apparatus according to claim 1, wherein the processing circuitry is further configured to perform the deformation in accordance with a value obtained by multiplying the motion feature amount with a predetermined weight.

7. The magnetic resonance imaging apparatus according to claim 1, wherein the k-space central portion is a one-dimensional region in a three-dimensional k-space.

8. The magnetic resonance imaging apparatus according to claim 1, wherein the k-space central portion is a two-dimensional region in a three-dimensional k-space.

9. An MR image reconstruction apparatus comprising processing circuitry configured to:

acquire time-series k-space data by performing stack-of-stars data acquisition on an imaging region of a subject;

divide the time-series k-space data into a plurality of groups relating to a time direction and calculate a motion feature amount indicative of a degree of motion of the imaging region based on k-space data of a k-space central portion for each of the groups, wherein each of the plurality of groups is a group of spokes of a same angle;

correct the k-space data based on the motion feature amount for each of the groups and generate corrected k-space data;

reconstruct an MR image relating to the imaging region based on the corrected k-space data relating to the plurality of groups; and deform an intermediate image, which has been generated by performing for each of the groups a one-dimensional or two-dimensional Fourier transform on the k-space data of the k-space central portion with respect to a k-space direction, in accordance with the motion feature amount with respect to a real-space direction, and generate corrected k-space data by performing one-dimensional or two-dimensional Fourier transform on the deformed intermediate image with respect to the k-space direction.

10. An MR image reconstruction method comprising:

acquiring time-series k-space data by performing stack-of-stars data acquisition on an imaging region of a subject;

dividing the time-series k-space data into a plurality of groups relating to a time direction, wherein each of the plurality of groups is a group of spokes of a same angle;

calculating for each of the groups a motion feature amount indicative of a degree of movement of the imaging region based on k-space data of a k-space central portion every predetermined interval of time;

generating corrected k-space data by correcting for each of the groups the k-space data based on the motion feature amount;

reconstructing an MR image relating to the imaging region based on the corrected k-space data relating to the plurality of groups;

deforming an intermediate image, which has been generated by performing for each of the groups a one-dimensional or two-dimensional Fourier transform on the k-space data of the k-space central portion with respect to a k-space direction, in accordance with the motion feature amount with respect to a real-space direction; and generating corrected k-space data by performing one-dimensional or two-dimensional Fourier transform on the deformed intermediate image with respect to the k-space direction.

* * * * *